(12) United States Patent
Taniguchi et al.

(10) Patent No.: US 7,561,606 B2
(45) Date of Patent: Jul. 14, 2009

(54) SEMICONDUCTOR LASER, METHOD OF MOUNTING SEMICONDUCTOR LASER, SEMICONDUCTOR LASER MOUNTED STRUCTURE, AND OPTICAL DISK SYSTEM

(75) Inventors: Manabu Taniguchi, Miyagi (JP); Motonobu Takeya, Miyagi (JP); Tsuyoshi Fujimoto, Miyagi (JP); Masao Ikeda, Miyagi (JP); Toshihiro Hashidu, Miyagi (JP)

(73) Assignee: Sony Corporation, Tokyo (JP)

( * ) Notice: Subject to any disclaimer, the term of this patent is extended or adjusted under 35 U.S.C. 154(b) by 104 days.

(21) Appl. No.: 11/264,538

(22) Filed: Oct. 31, 2005

(65) Prior Publication Data
US 2006/0171435 A1    Aug. 3, 2006

(30) Foreign Application Priority Data
Nov. 1, 2004    (JP)    ............................ P2004-318096

(51) Int. Cl.
*H01S 3/04* (2006.01)
(52) U.S. Cl. ............... 372/43.01; 372/45.01; 372/46.01
(58) Field of Classification Search .................. 372/36, 372/50.12, 43.01–50.11
See application file for complete search history.

(56) References Cited

U.S. PATENT DOCUMENTS

| 5,499,260 | A | * | 3/1996 | Takahashi et al. ...... 372/46.015 |
| 5,822,287 | A | | 10/1998 | Kubota et al. |
| 6,136,623 | A | * | 10/2000 | Hofstetter et al. ............. 438/28 |
| 2003/0042476 | A1 | | 3/2003 | Nakahara et al. |
| 2004/0012032 | A1 | * | 1/2004 | Toda et al. .................. 257/103 |
| 2004/0159836 | A1 | * | 8/2004 | Sugimoto et al. ............. 257/40 |
| 2004/0164308 | A1 | | 8/2004 | Asatsuma et al. |
| 2005/0041700 | A1 | * | 2/2005 | Tsunoda ...................... 372/23 |

FOREIGN PATENT DOCUMENTS

| CN | 1138916 A | 12/1996 |
| JP | 2000323777 | * 11/2000 |
| JP | 2003-124572 | 4/2003 |

OTHER PUBLICATIONS

Chinese Office Action issued on Dec. 19, 2008.

* cited by examiner

*Primary Examiner*—Minsun Harvey
*Assistant Examiner*—Xnning Niu
(74) *Attorney, Agent, or Firm*—Sonnenschein Nath & Rosenthal LLP (57) ABSTRACT

An upper portion of a second clad layer and a contact layer are provided with grooves so as to form a ridge therebetween. An electrode is formed on the ridge. An insulation film is formed to extent on side surfaces of the ridge, on the inside of the grooves, and those portions of the contact layer which are located on the outside of the grooves. The thickness of those portions of the insulation film which are located on the contact layer in the areas on the outside of the grooves is set to be greater than at least the thickness of the electrode. Besides, a pad electrode is formed to cover the electrode and to extend on the insulation film on the upper side of the areas on the outside of the grooves. The upper surfaces of those portions of the pad electrode which are located on the upper side of the areas on the outside of the grooves are set to be above the upper surface of that portion of the pad electrode which is located on the upper side of the ridge.

9 Claims, 6 Drawing Sheets

FIG. 9D

SEMICONDUCTOR LASER, METHOD OF MOUNTING SEMICONDUCTOR LASER, SEMICONDUCTOR LASER MOUNTED STRUCTURE, AND OPTICAL DISK SYSTEM

CROSS REFERENCES TO RELATED APPLICATIONS

The present invention contains subject matter related to Japanese Patent Application 2004-318096 filed with the Japanese Patent Office on Nov. 1, 2004, the entire contents of which being incorporated herein by reference.

BACKGROUND OF THE INVENTION

The present invention relates to a semiconductor laser, a method of mounting a semiconductor laser, a semiconductor laser mounted structure, and an optical disk system, which are suitable for application to, for example, a semiconductor laser using a nitride type Group III-V compound semiconductor and an optical disk system using the semiconductor laser as a light source.

Figure 8:
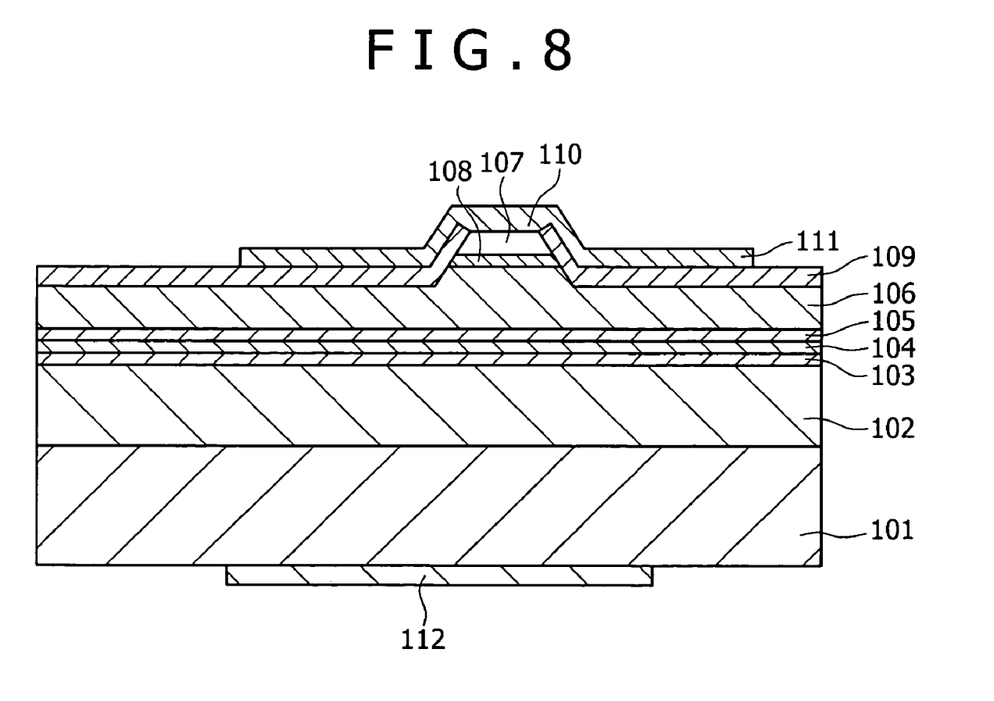
FIG. 8 is a sectional diagram showing a GaN based semiconductor laser according to the related art.

FIG. 8 shows a GaN based semiconductor laser using a GaN substrate according to the related art. As shown in FIG. 8, in this GaN based semiconductor laser, an n-type AlGaN clad layer 102, an n-type GaN light waveguide layer 103, an active layer 104 of an undoped $Ga_{1-x}In_xN$ (well layer)/$Ga_{1-y}In_yN$ (barrier layer, x>y) multiple quantum well structure, a p-type GaN light waveguide layer 105, a p-type GaN/AlGaN superlattice clad layer 106, and a p-type GaN contact layer 107 are sequentially laminated on an n-type GaN substrate 101. An upper portion of the p-type GaN/AlGaN superlattice clad layer 106 and the p-type GaN contact layer 107 are provided with a ridge 108 extending rectilinearly in one direction. An insulation layer 109 is formed to extend on the side surfaces of the ridge 108 and on those portions of the p-type GaN/AlGaN superlattice clad layer 106 which are located on the outside of the ridge 108. A p-side electrode 110 is formed on the ridge 108 in electrical contact with the p-type GaN contact layer 107. In addition, a pad electrode 111 is formed in electrical contact with the p-side electrode 110 so as to cover the p-side electrode 110 and the insulation layer 109. On the other hand, an n-side electrode 112 is formed in electrical contact with the back side of the n-type GaN substrate 101.

The semiconductor laser using a GaN substrate is disclosed, for example, in Japanese Patent Laid-open No. 2003-124572.

Figure 9A:
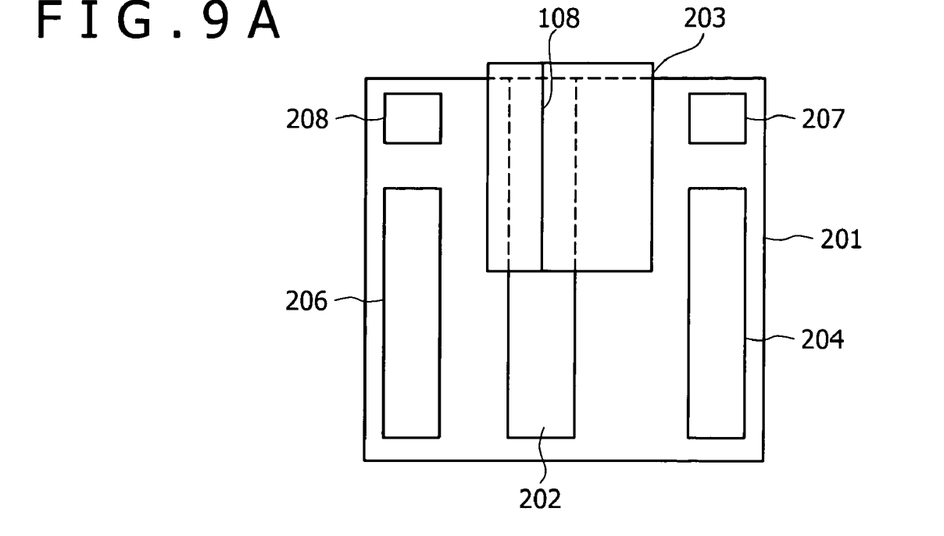
FIGS. 9A to 9D are respectively a top plan view, a side view of a GaN based semiconductor laser as viewed from the rear side, a side view of the GaN based semiconductor laser as viewed from a lateral side, and a side view of the GaN based semiconductor laser as viewed from the rear side, for illustrating a method of mounting the GaN based semiconductor laser according to the related art.
Figure 9B:
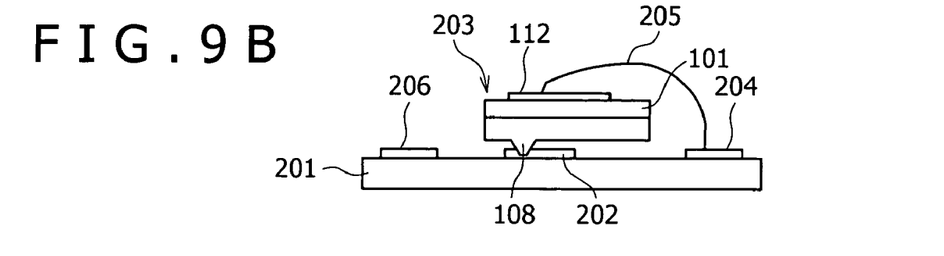

A method for mounting the above-mentioned GaN semiconductor laser will be described. As shown in FIG. 9A (top plan view), a solder 202 composed of Sn or an Sn mixed crystal metal such as AgSn and AuSn is formed in a stripe form on the upper surface of a rectangular sub-mount 201, a GaN based semiconductor laser chip 203 is so positioned that its ridge 108 is located on the stripe form solder 202, and a pressure is applied to the GaN based semiconductor laser chip 203 in the condition where the solder 202 is molten, thereby mounting the GaN based semiconductor laser chip 203 on the sub-mount 201. Then, as shown in FIG. 9B (a side view as viewed from a rear side end face), a stripe form bonding pad 204 formed on a peripheral portion of the sub-mount 201 and the n-side electrode 112 of the GaN based semiconductor laser chip 203 are bonded to each other by a wire 205. The sub-mount 201 is provided thereon with another stripe form bonding pad 206 in an area on the opposite side of the area where the bonding pad 204 is formed. Image recognition patterns 207 and 208 for use in positioning of the GaN based semiconductor laser chip 203 and the sub-mount 201 are provided respectively on two corner portions of the sub-mount 201.

SUMMARY OF THE INVENTION

However, the above-mentioned GaN based semiconductor laser according to the related art has the problems of a high electrostatic capacity between the pad electrode 111 and the n-side electrode 112 opposed thereto, and bad high-frequency characteristics, and has a further problem that such defects as current leak and dielectric breakdown are liable to be generated and they are conspicuous particularly where the semiconductor laser is mounted in the so-called p-down fashion.

Figure 9C:
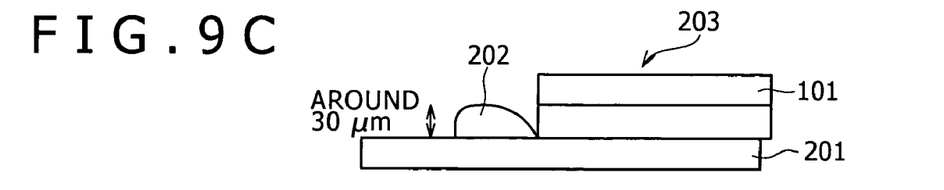
Figure 9D:
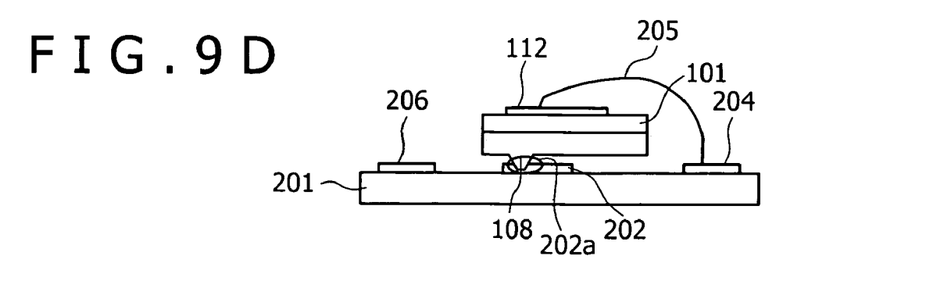

In addition, as shown in FIG. 9C (side view), when a pressure is exerted at the time of mounting the GaN based semiconductor laser chip 203 on the sub-mount 201, in practice, the solder 202 would flow out sideways and become protuberant. Generally, the height of the protuberant portion 202a is around 30 μm. A side view of this condition as viewed from the rear-side end face is shown in FIG. 9D. As shown in FIGS. 9C and 9D, the protuberant portion 202a may make contact with the rear-side end face, resulting in that current leak or dielectric breakdown is liable to occur between the p side and the n side.

Therefore, there is a need for a semiconductor laser in which the electrostatic capacity between a pad electrode and an electrode opposed thereto is small, which have favorable high-frequency characteristics and which can prevent the occurrence of defects due to current leak or dielectric breakdown, a method of mounting a semiconductor laser by which the semiconductor laser can be favorably mounted without occurrence of current leak or dielectric breakdown, and a semiconductor laser mounted structure including the semiconductor laser mounted by the method.

Also, there is a need for an optical disk system using the semiconductor laser as a light source.

According to an embodiment of the present invention, there is provided a semiconductor laser including:

a substrate;

a first clad layer of a first conduction type on the substrate;

an active layer on the first clad layer;

a second clad layer of a second conduction type on the active layer; and a contact layer of the second conduction type on the second clad layer, wherein an upper portion of the second clad layer and the contact layer are provided with a pair of grooves in parallel to each other and at a predetermined interval so as to form a ridge therebetween;

an electrode on the second conduction type side is formed on the ridge;

an insulation layer is provided on side surfaces of the ridge, on the inside of the grooves, and on the contact layer in the areas on the outside of the grooves, and the thickness of those portions of the insulation layer which are located on the contact layer in the areas on the outside of the grooves is greater than at least the thickness of the electrode on the second conduction type side; and a pad electrode is formed to cover the electrode on the second conduction type side and to extend on the insulation layer on the upper side of the areas on the outside of the grooves, and the upper surfaces of those portions of the pad electrode which are located on the upper side of the areas on the outside of the grooves are located above the upper surface of that portion of the pad electrode which is located on the upper side of the ridge.

According to another embodiment of the present invention, there is provided a method of mounting a semiconductor laser on a sub-mount, the semiconductor laser including:

a substrate;

a first clad layer of a first conduction type on the substrate;

an active layer on the first clad layer;

a second clad layer of a second conduction type on the active layer; and a contact layer of the second conduction type on the second clad layer, wherein an upper portion of the second clad layer and the contact layer are provided with a pair of grooves in parallel to each other and at a predetermined interval so as to form a ridge therebetween;

an electrode on the second conduction type side is formed on the ridge;

an insulation layer is provided on side surfaces of the ridge, on the inside of the grooves, and on the contact layer in the areas on the outside of the grooves, and the thickness of those portions of the insulation layer which are located on the contact layer in the areas on the outside of the grooves is greater than at least the thickness of the electrode on the second conduction type side;

a pad electrode is formed to cover the electrode on the second conduction type side and to extend on the insulation layer on the upper side of the areas on the outside of the grooves, and the upper surfaces of those portions of the pad electrode which are located on the upper side of the areas on the outside of the grooves are located above the upper surface of that portion of the pad electrode which is located on the upper side of the ridge; and the semiconductor laser is mounted on the sub-mount by soldering, during when the pattern of the solder is so determined that the solder is absent on the extension line of the ridge of the semiconductor laser, and positioning is so conducted-that an end face on the front side of the semiconductor laser protrudes to the outside of the sub-mount.

According to a further embodiment of the present invention, there is provided a semiconductor laser mounted structure including a semiconductor laser mounted on a sub-mount, the semiconductor laser including:

a substrate;

a first clad layer of a first conduction type on the substrate;

an active layer on the first clad layer;

a second clad layer of a second conduction type on the active layer; and a contact layer of the second conduction type on the second clad layer, wherein an upper portion of the second clad layer and the contact layer are provided with a pair of grooves in parallel to each other and at a predetermined interval so as to form a ridge therebetween;

an electrode on the second conduction type side is formed on the ridge;

an insulation layer is provided on side surfaces of the ridge, on the inside of the grooves, and on the contact layer in the areas on the outside of the grooves, and the thickness of those portions of the insulation layer which are located on the contact layer in the areas on the outside of the grooves is greater than at least the thickness of the electrode on the second conduction type side;

a pad electrode is formed to cover the electrode on the second conduction type side and to extend on the insulation layer on the upper side of the areas on the outside of the grooves, and the upper surfaces of those portions of the pad electrode which are located on the upper side of the areas on the outside of the grooves are located above the upper surface of that portion of the pad electrode which is located on the upper side of the ridge; and the semiconductor laser is mounted on the sub-mount by soldering, during when the pattern of the solder is so determined that the solder is absent on the extension line of the ridge of the semiconductor laser, and positioning is so conducted that an end face on the front side of the semiconductor laser protrudes to the outside of the sub-mount.

According to yet another embodiment of the present invention, there is provided an optical disk system using a semiconductor laser as a light source, the semiconductor laser including:

a substrate;

a first clad layer of a first conduction type on the substrate;

an active layer on the first clad layer;

a second clad layer of a second conduction type on the active layer; and a contact layer of the second conduction type on the second clad layer, wherein an upper portion of the second clad layer and the contact layer are provided with a pair of grooves in parallel to each other and at a predetermined interval so as to form a ridge therebetween;

an electrode on the second conduction type side is formed on the ridge;

an insulation layer is provided on side surfaces of the ridge, on the inside of the grooves, and on the contact layer in the areas on the outside of the grooves, and the thickness of those portions of the insulation layer which are located on the contact layer in the areas on the outside of the grooves is greater than at least the thickness of the electrode on the second conduction type side; and a pad electrode is formed to cover the electrode on the second conduction type side and to extend on the insulation layer on the upper side of the areas on the outside of the grooves, and the upper surfaces of those portions of the pad electrode which are located on the upper side of the areas on the outside of the grooves are located above the upper surface of that portion of the pad electrode which is located on the upper side of the ridge.

In the semiconductor laser, the method of mounting a semiconductor laser, the semiconductor laser mounted structure, and the optical disk system according to the present invention, the insulation film may basically be formed of any material that is electrically insulating or is sufficiently high in electric resistance. From the viewpoint of reduction in electrostatic capacity of the semiconductor laser, however, a material with a low dielectric constant is preferred for use in forming the insulation film. The insulation film may have a single-layer structure or a multi-layer structure. Where the insulation film has a two-layer structure, the upper layer is preferably composed of a film having a high absorption coefficient for the light at the oscillation wavelength; for example, where the wavelength of the laser beam is in the violet wavelength band, an undoped Si film is preferably used to constitute the upper layer. In addition, the difference between the thickness of those portions of the insulation film which are located on the contact layer in the areas on the outside of the grooves and the thickness of the electrode on the second conduction type side is typically selected in the range of from 50 nm to 1 µm. Similarly, the height difference between the upper surfaces of those portions of the pad electrode which are located on the upper side of the areas on the outside of the grooves and the upper surface of that portion of the pad electrode which is located on the upper side of the ridge is typically selected in the range of from 50 nm to 1 µm.

The substrate is typically a conductive substrate. The first clad layer, the active layer, the second clad layer, and the contact layer are typically composed of a nitride based Group III-V compound semiconductor. In this case, the substrate is typically a nitride based Group III-V compound semiconductor substrate. The nitride based Group III-V compound semiconductor is most generally composed of $Al_xB_yGa_{1-x-y-z}In_zAs_uN_{1-u-v}P_v$ (where $0 \leq x \leq 1$, $0 \leq y \leq 1$, $0 \leq z \leq 1$, $0 \leq u \leq 1$, $0 \leq v \leq 1$, $0 \leq x+y+z<1$, and $0 \leq u+v<1$), more specifically composed of $Al_xB_yGa_{1-x-y-z}In_zN$ (where $0 \leq x \leq 1$, $0 \leq y \leq 1$, $0 \leq z \leq 1$, and $0 \leq x+y+z<1$), and typically composed of $Al_xGa_{1-x-z}In_zN$ (where $0 \leq x \leq 1$, and $0 \leq z \leq 1$). Most typically, the substrate is a GaN substrate. Typically, an electrode on the first conduction type side is formed on the back side of the conductive substrate.

The optical disk system includes those for exclusive use for reproduction (reading), those for exclusive use for recording (writing), and those capable of reproduction and recording.

In the semiconductor laser, the method of mounting a semiconductor laser, the semiconductor laser mounted structure, and the optical disk system according to the present invention configured as above, the insulation film is formed on the side surfaces of the ridge, on the inside of the grooves, and on the contact layer in the areas on the outside of the grooves, and the thickness of those portions of the insulation film which are located on the contact layer in the areas on the outside of the grooves is greater than at least the thickness of the electrode on the second conduction type side, whereby the distance between the pad electrode and the electrode formed on the back side of the substrate can be set at least partly longer than that in the related art. Besides, the upper surfaces of those portions of the pad electrode which are located on the upper side of the areas on the outside of the grooves are located above the upper surface of that portion of the pad electrode located on the upper side of the ridge, so that in the case of mounting the semiconductor laser on the sub-mount with the pad electrode down, the load is exerted on the upper surfaces of those portions of the pad electrode which are located on the upper side of the areas on the outside of the grooves, and little load is exerted on the upper surface of that portion of the pad electrode which is located on the upper side of the ridge.

According to the present invention, the distance between the pad electrode and the electrode formed on the back side of the substrate can be set at least partly longer than that in the related art. This makes it possible to contrive a reduction in the electrostatic capacity between the pad electrode and the electrode formed on the back side of the substrate, thereby to contrive an enhancement of high-frequency characteristics, and to prevent the occurrence of current leak or dielectric breakdown. In addition, in the case of mounting this semiconductor laser on the sub-mount, it is possible to ensure that no load is exerted on the ridge, so that generation of failures in the semiconductor laser can be prevented. Furthermore, the use of this semiconductor laser as a light source makes it possible to realize a high-performance optical disk system.

DETAILED DESCRIPTION OF THE PREFERRED EMBODIMENTS

Now, some embodiments of the present invention will be described below referring to the drawings. Incidentally, in all the views and diagrams illustrating the embodiments, the same or corresponding portions will be denoted by the same symbols.

Figure 1:
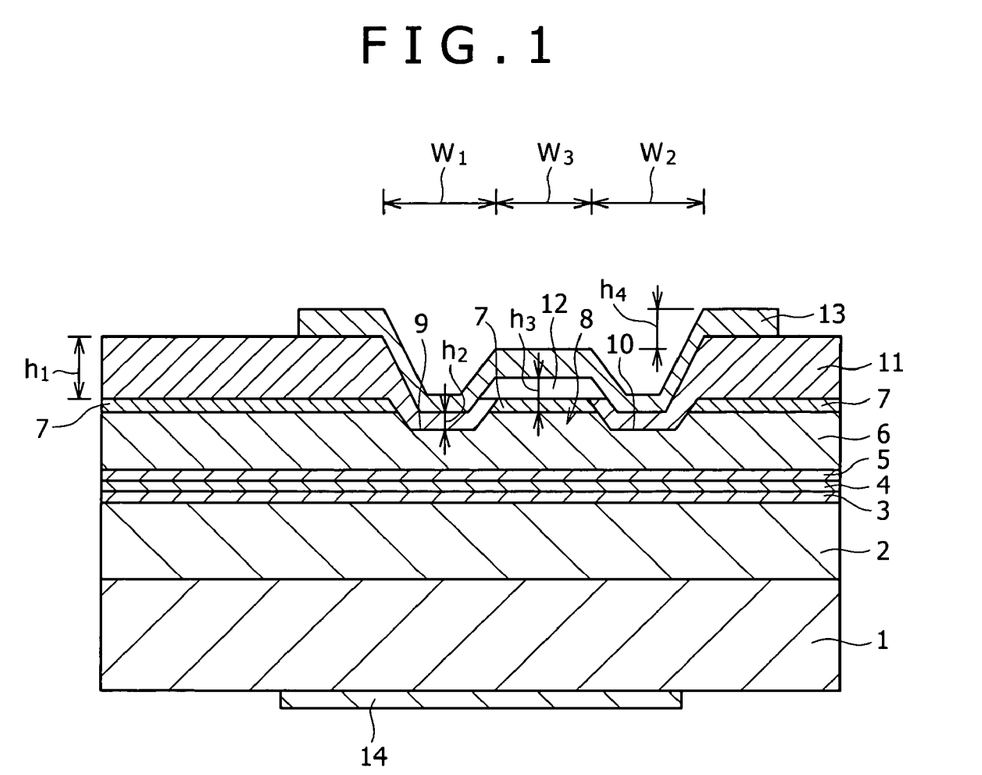
FIG. 1 is a sectional diagram showing a GaN based semiconductor laser according to a first embodiment of the present invention.

FIG. 1 shows a GaN based semiconductor laser according to a first embodiment of the present invention.

As shown in FIG. 1, in the GaN based semiconductor laser, an n-type AlGaN clad layer 2, an n-type GaN light waveguide layer 3, an active layer 4 of an undoped $Ga_{1-x}In_xN$ (well layer)/$Ga_{1-y}In_yN$ (barrier layer, x>y) multiple quantum well structure, a p-type GaN light waveguide layer 5, a p-type GaN/AlGaN superlattice clad layer 6, and a p-type GaN contact layer 7 are sequentially laminated on an n-type GaN substrate 1. An upper portion of the p-type GaN/AlGaN superlattice clad layer 6 and the p-type GaN contact layer 7 are provided with a ridge 8 extending rectilinearly in one direction. Grooves 9 and 10 are formed respectively on both sides of the ridge 8. An insulation layer 11 composed, for example, of an $SiO_2$ film and an undoped Si film thereon is formed on the side surfaces of the ridge 8, on the inside of the grooves 9 and 10, and further on those portions of the p-type GaN contact layer 7 which are located on the outside of the grooves 9 and 10. A p-side electrode 12 is formed on the ridge 8, in electrical contact with the p-type GaN contact layer 7. The p-side electrode 12 covers both the insulation layer 11 and the p-type GaN contact layer 7. In addition, a pad electrode 13 is formed so as to cover the p-side electrode 12 and the insulation film 11, in electrical contact with the p-side electrode 12. On the other hand, an n-side electrode 14 is formed on the back side of the n-type GaN substrate 1, in electrical contact with the n-type GaN substrate 1.

Here, examples of the GaN based semiconductor layers constituting the laser structure are as follows: the n-type AlGaN clad layer 2 is 1200 nm, the n-type GaN light waveguide layer 3 is 12 nm, the well layer of the active layer 4 is 3.5 nm (the number of wells is 3), the barrier layer of the active layer 4 is 7 nm, the p-type GaN light waveguide layer 5 is 12.3 nm, and the p-type GaN/AlGaN superlattice clad layer 6 is 400 nm. Besides, the Al content in the n-type AlGaN clad layer 2 is, for example, 0.05, and the Al content in the AlGaN layer of the p-type GaN/AlGaN superlattice clad layer 6 is, for example, 0.08.

In addition, let the thickness of those portions of the insulation film 11 which are located on the flat portions on the outside of the grooves 9 and 10 be $h_1$, and let the thickness of those portions of the insulation film 11 which are located on the bottom portions of the grooves 9 and 10 be $h_2$, then, for example, 200 nm$\leq h_2$ or 150 nm$\leq h_2$ or 50 nm$\leq h_2$, and $h_2 \leq h_1$. Besides, let the thickness of the p-side electrode 12 be $h_3$, and let the height difference between the upper surfaces of those flat portions of the pad electrode 13 which are located on both sides and the upper surface of that flat portion of the pad electrode 13 which is located on the p-side electrode 12 be $h_4$, then $h_4 > h_3$, and 50 nm$\leq h_4 \leq 1$ µm or 100 nm$\leq h_4 \leq 0.5$ µm. Furthermore, let the widths of those recessed portions of the pad electrode 13 which are located on the upper side of the grooves 9 and 10 be respectively $W_1$ and $W_2$, and let the width of that flat portion of the pad electrode 13 which is located on the upper side of the ridge 8 be $W_3$, then $W_1$, $W_2 \leq 250$ µm or $W_1$, $W_2 \leq 100$ µm or $W_1$, $W_2 \leq 20$ µm, and $W_3 \leq 100$ µm or $W_3 \leq 30$ µm or $W_3 \leq 10$ µm.

Now, a method of producing this GaN based semiconductor laser will be described below.

First, the n-type AlGaN clad layer 2, the n-type GaN light waveguide layer 3, the active layer 4, the p-type GaN light waveguide layer 5, the p-type GaN/AlGaN superlattice clad layer 6, and the p-type GaN contact layer 7 are sequentially epitaxially grown on the n-type GaN substrate 1 by, for example, the metallo-organic chemical vapor deposition (MOCVD) process or the like. Next, an insulation film (not shown) such as, for example, an SiO$_2$ film is formed on the entire surface, and then the insulation film is patterned into a predetermined shape by etching. Subsequently, by dry etching such as the reactive ion etching (RIE) process using the insulation film as an etching mask, etching is conducted to an intermediate depth in the thickness direction of the p-type GaN/AlGaN superlattice clad layer 6 to form the grooves 9 and 10, thereby forming the ridge 8. Next, while leaving the insulation film used as the etching mask as it is, an SiO$_2$ film and an undoped Si film, for example, are sequentially formed on the entire surface, and then these films on the upper side of the ridge 8 are selectively etched away. As a result, the insulation film 11 of which the thickness is $h_1$, in the areas of the grooves 9 and 10 and is $h_2$ ($\geq h_1$) in the areas on the outside of the grooves 9 and 10 is formed. Subsequently, the p-side electrode 12 is formed on the ridge 8, and further the pad electrode 13 is formed thereon. Next, the n-type GaN substrate 1 is polished from the back side thereof, whereby the n-type GaN substrate 1 is thinned to a predetermined thickness. Subsequently, the n-side electrode 14 is formed on the back side of the n-type GaN substrate 1. In this manner, the GaN based semiconductor laser shown in FIG. 1 is produced.

Figure 2:
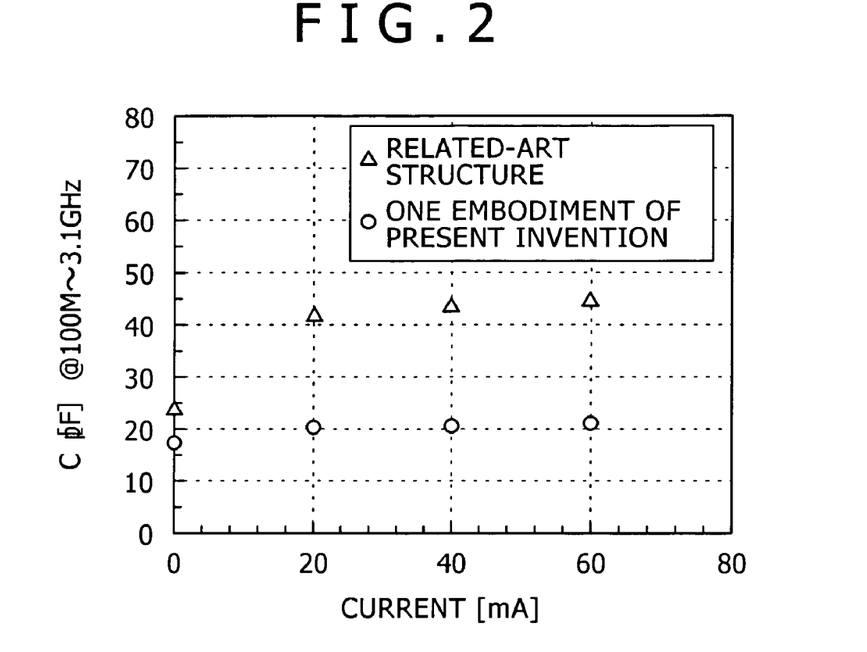
FIG. 2 is a schematic diagram showing the measurement results of electrostatic capacity of the GaN based semiconductor laser according to the first embodiment of the present invention.

FIG. 2 shows the measurement results of the electrostatic capacity C between the pad electrode 13 and the n-side electrode 14 in the GaN based semiconductor laser according to the first embodiment. In FIG. 2, for comparison, the measurement results of the electrostatic capacity C between the pad electrode 111 and the n-type electrode 112 in the GaN based semiconductor laser according to the related art shown in FIG. 8 are also shown. FIG. 2 shows that, in the GaN based semiconductor laser according to the first embodiment, the electrostatic capacity C of the capacitor is reduced by half, as compared with the GaN based semiconductor laser according to the related art.

Figure 3:
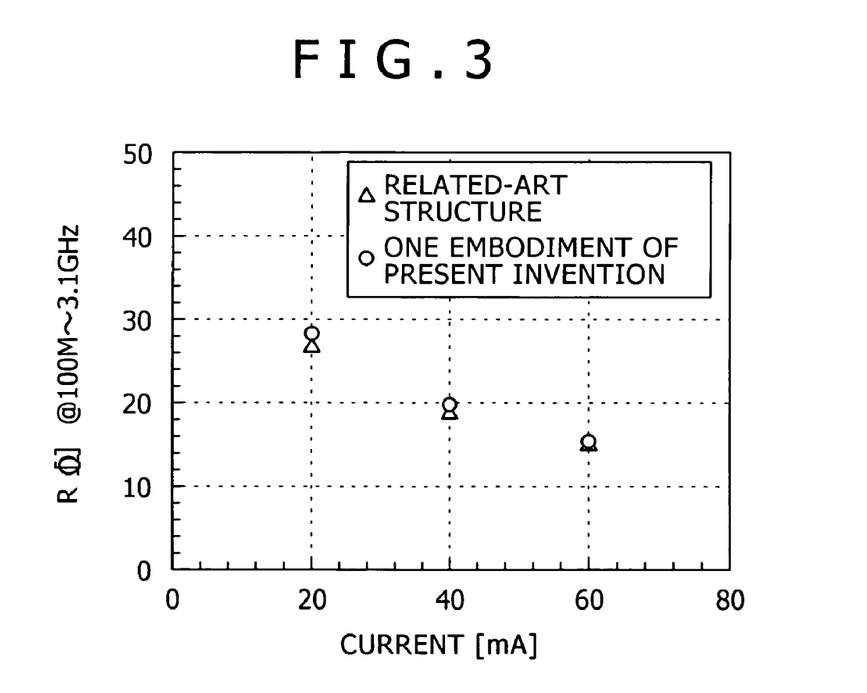
FIG. 3 is a schematic diagram showing the measurement results of resistance of the GaN based semiconductor laser according to the first embodiment of the present invention.

FIG. 3 shows the measurement results of the resistance R between the pad electrode 13 and the n-side electrode 14 in the GaN based semiconductor laser according to the first embodiment. In FIG. 3, for comparison, the measurement results of the resistance R between the pad electrode 111 and the n-side electrode 112 in the GaN based semiconductor laser according to the related art shown in FIG. 8 are also shown. It is seen from FIG. 3 that the resistance R in the GaN based semiconductor laser according to the first embodiment is substantially equal to the resistance R in the GaN based semiconductor laser according to the related art.

Figure 4:
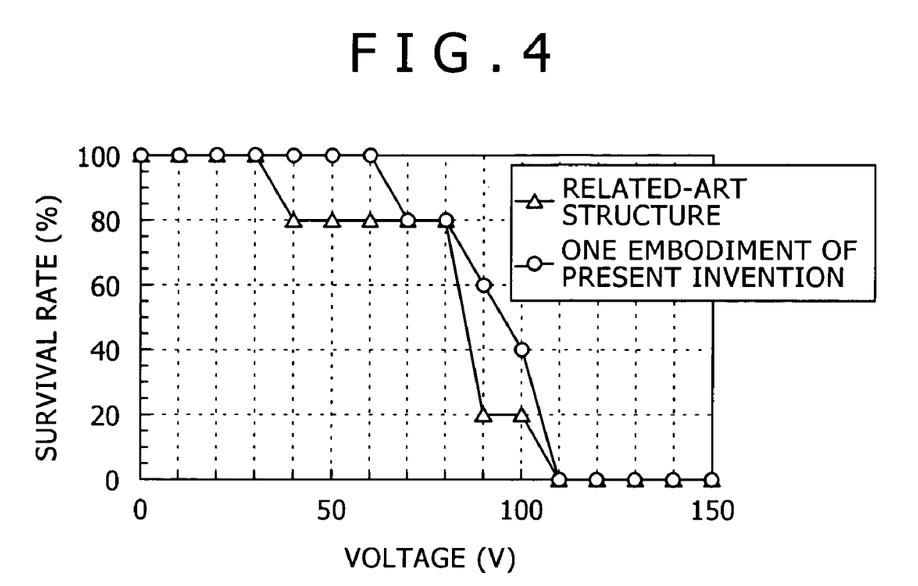
FIG. 4 is a schematic diagram showing the results of a forward dielectric breakdown test of the GaN based semiconductor laser according to the first embodiment of the present invention.

FIG. 4 shows the results of a dielectric breakdown test conducted by impressing a forward voltage between the pad electrode 13 and the n-side electrode 14 in the GaN based semiconductor laser according to the first embodiment. It should be noted here that the insulation film 11 is composed of two layers, i.e., an SiO$_2$ film and an undoped Si film thereon, and $h_1$=400 nm and $h_2$=200 nm. In FIG. 4, for comparison, the results of a dielectric breakdown test conducted by impressing a forward voltage between the pad electrode 111 and the p-side electrode 112 in the GaN based semiconductor laser according to the related art are also shown. It should be noted here that the insulation film 109 is composed of two layers, i.e., an SiO$_2$ film and an undoped Si film thereon, and has a thickness of 200 nm. It is seen from FIG. 4 that the withstand voltage of the GaN based semiconductor laser according to the first embodiment has been increased by no less than 30 V, as compared with that of the GaN based semiconductor laser according to the related art.

Figure 5:
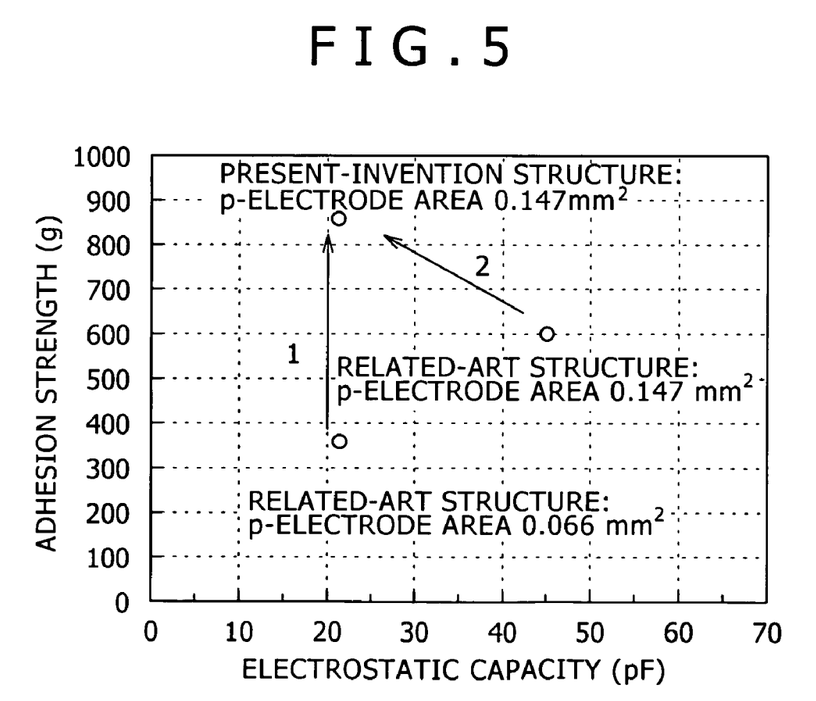
FIG. 5 is a schematic diagram showing the measurement results of adhesion strength in adhesion onto a sub-mount of the GaN based semiconductor laser according to the first embodiment of the present invention.

FIG. 5 is a diagram in which the adhesion strength in the case of mounting the GaN based semiconductor laser according to the first embodiment on a sub-mount, with the pad electrode 13 down, i.e., in the so-called p-down fashion, is plotted against the electrostatic capacity C. In FIG. 5, for comparison, the adhesion strength in the case of mounting the GaN based semiconductor laser according to the related art shown in FIG. 8, on a sub-mount, with the pad electrode 111 down, is also plotted against the electrostatic capacity C. FIG. 5 shows that, in the GaN based semiconductor laser according to the first embodiment, when the area of the pad electrode 13 is 0.147 mm$^2$, the adhesion strength is as high as about 860 g, and the electrostatic capacity C is as small as about 20 pF. On the other hand, in the GaN based semiconductor laser according to the related art, when the area of the pad electrode 111 is 0.066 mm$^2$, the electrostatic capacity C is as low as about 20 pF, but the adhesion strength is as low as about 360 g; when the area of the pad electrode 111 is 0.147 mm$^2$, the adhesion strength is as low as about 600 g, and the electrostatic capacity C is as great as about 45 pF.

Thus, according to the first embodiment, the following various merits can be obtained. Since the ridge 8 is formed by forming the grooves 9 and 10 in the upper portion of the p-type GaN/AlGaN superlattice clad layer 6 and the p-type GaN contact layer 7, the flat portions on the outside of the grooves 9 and 10 on both sides of the ridge 8 are at the same height as the ridge 8. Moreover, the thicknesses $h_1$, and $h_2$ of the insulation film 11 can be set greater than in the related art, and, particularly, the thickness $h_1$, of the insulation film 11 in the areas where both end portions of the pad electrode 13 extend can be set extremely greater than in the related art, so that the distance between the pad electrode 13 and the n-side electrode 14 can be enlarged, whereby the electrostatic capacity C therebetween can be reduced, as shown in FIG. 2. Besides, in this case, the resistance R between the pad electrode 13 and the n-side electrode 14 remains unchanged, as shown in FIG. 3, so that the adjustment between the GaN based semiconductor laser and a drive circuit therefore is easy to carry out. Specifically, while the electrostatic capacity C and the resistance R in the GaN based semiconductor laser are important factors in adjustment between the semiconductor laser and the drive circuit, the adjustment is easy to achieve because the electrostatic capacity C can be regulated without changing the resistance R. In addition, since the distance between the pad electrode 13 and the n-side electrode 14 can be enlarged, current leak and dielectric breakdown would not easily occur even in the case where the GaN based semiconductor laser is mounted on the sub-mount in the p-down fashion, as shown in FIG. 4. Besides, since the upper surfaces of those portions of the pad electrode 13 which are located in the areas on the outside of the grooves 9 and 10 are located above the upper surface of that portion of the pad electrode 13 which is located on the upper side of the ridge 8, the load is exerted on the higher upper surfaces of the pad electrode 13 in the case of mounting the GaN based semiconductor laser on the sub-mount in the p-down fashion. Therefore, the load exerted on the ridge 8 can be reduced to an extremely low level. In addition, where the electrostatic capacity C is kept unchanged, the area of the pad electrode 13 can be enlarged, as compared with that in the related art. Therefore, it is possible to contrive an enhancement of the adhesion strength in the case of mounting the GaN based semiconductor laser on the sub-mount in the p-down fashion, as shown in FIG. 5. Furthermore, during the dry etching carried out for forming the ridge 8, the etched surface may be roughened, and dielectric breakdown may occur starting from the protuberant portions formed in the surface due to the roughening. However, since the ridge 8 can be formed by only forming the grooves 9 and 10, the etching area is extremely smaller than that in the related art, so that the dielectric breakdown would not easily occur, which is advantageous.

Thus, a high-performance GaN based semiconductor laser can be realized, and, by mounting the GaN based semiconductor laser on a sub-mount, a highly reliable GaN based semiconductor laser mounted structure can be realized. The GaN based semiconductor laser and the GaN based semiconductor laser mounted structure are suitable for use as a light source for an optical pickup in an optical disk system, for example.

Next, a second embodiment of the present invention will be described below. In the second embodiment, a method of mounting the GaN based semiconductor laser according to the first embodiment will be described.

Figure 6A:
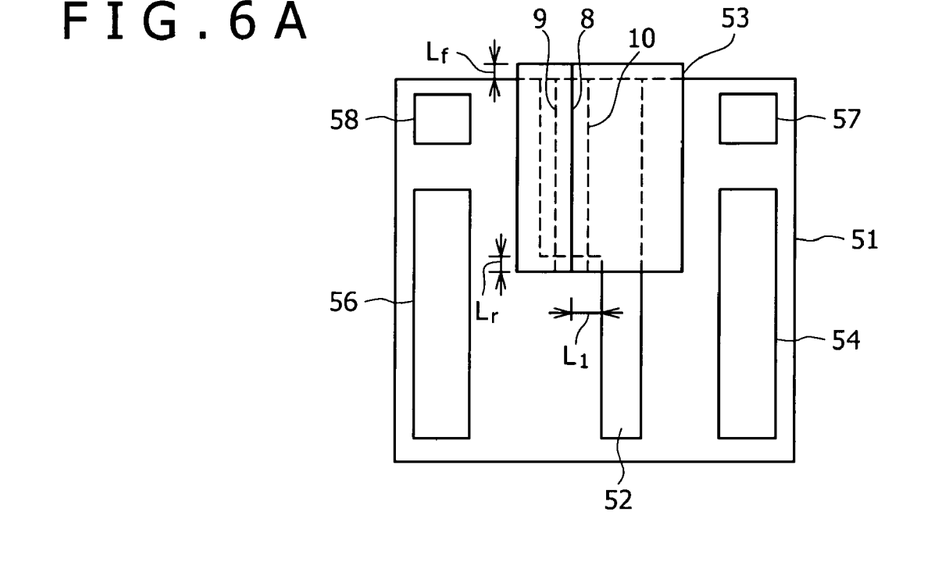
FIGS. 6A to 6D are respectively a top plan view, a side view of a GaN based semiconductor laser as viewed from the rear side, a side view of the GaN based semiconductor laser as viewed from a lateral side, and a side view of the GaN based semiconductor laser as viewed from the rear side, for illustrating a method of mounting a GaN based semiconductor laser according to a second embodiment of the present invention.
Figure 6B:
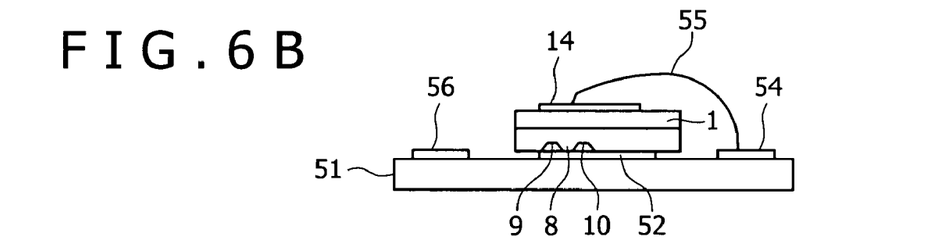

In the second embodiment, as shown in FIG. 6A (top plan view), a solder 52 composed of Sn, for example, is formed in an L shape consisting of a small-width portion and a large-width portion on the upper surface of a rectangular sub-mount 51 composed of AlN, for example. A GaN based semiconductor laser chip 53 is positioned so that the ridge 8 is located on the large-width portion of the solder 52, and, in the condition where the solder 52 is molten, a pressure is exerted on the GaN based semiconductor laser chip 53, thereby mounting the GaN based semiconductor laser chip 53. The overall length of the solder 52 is, for example, 800 to 900 µm, the length of the small-width portion is, for example, 280 to 320 µm, the length of the large-width portion is, for example, 480 to 620 µm, the width of the small-width portion is, for example, 90 to 100 µm, and the width of the large-width portion is, for example, 170 to 180 µm. In this instance, the distance $L_1$, between one side surface of the small-width portion of the solder 52 and the ridge 8 of the GaN based semiconductor laser chip 53 is set in the range of 0 µm<$L_1$≦100 µm, or 0 µm<$L_1$≦200 µm, or 0 µm<$L_1$≦300 µm, and specifically in the range of 25 to 35 µm, for example. In this case, the solder 52 is absent on the extension line of the ridge 8. In addition, the distance $L_f$ between one side surface of the sub-mount 51 and the front-side end face of the GaN based semiconductor laser chip 53 is set in the range of 0 µm <$L_f$≦50 µm, or 0 µm<$L_f$≦100 µm, or 0 µm<$L_f$≦200 µm. Besides, the distance $L_r$ between one end face of the large-width portion of the solder 52 and the rear-side end face of the GaN based semiconductor laser chip 53 is set in the range of 0 µm<$L_r$≦50 µm, or 0 µm<$L_r$≦100 µm, or 0 µm<$L_r$≦200 µm. Then, as shown in FIG. 6B (side view as viewed from the rear-side end face), a stripe form bonding pad 54 formed on a peripheral portion of the sub-mount 51 and the n-side electrode 14 of the GaN based semiconductor laser chip 53 are bonded to each other by a wire 55. Another stripe form bonding pad 56 is formed on a peripheral portion in an area on the opposite side of the area where the bonding pad 54 is formed. The bonding pad 54 and the n-side electrode 14 of the GaN based semiconductor laser chip 53 are bonded to each other by a wire 55. The bonding pads 54 and 56 are composed of Au, for example. Image recognition patterns 57 and 58 for use in positioning the GaN based semiconductor laser chip 53 and the sub-mount 51 are formed in two corner areas of the sub-mount 51.

Figure 7:
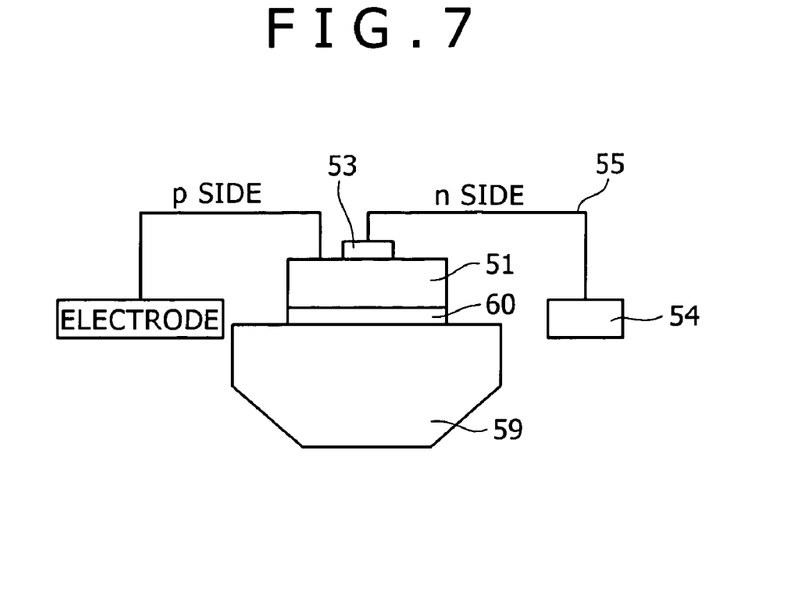
FIG. 7 is a schematic diagram showing the condition where a sub-mount with the GaN based semiconductor laser according to the second embodiment of the present invention mounted thereon is joined onto a heat sink.

As shown in FIG. 7, the sub-mount 51 with the GaN based semiconductor laser chip 53 mounted thereon as above is joined onto a heat sink 59 by use of a solder 60.

Figure 6C:
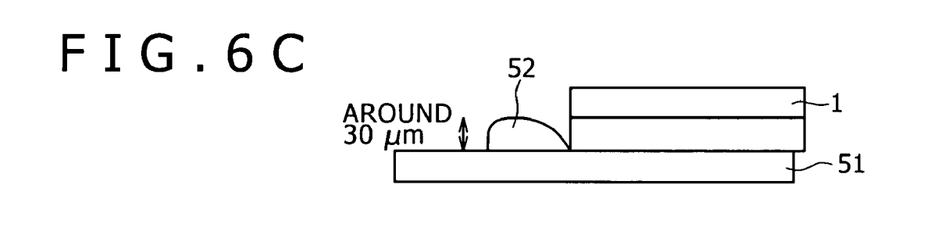
Figure 6D:
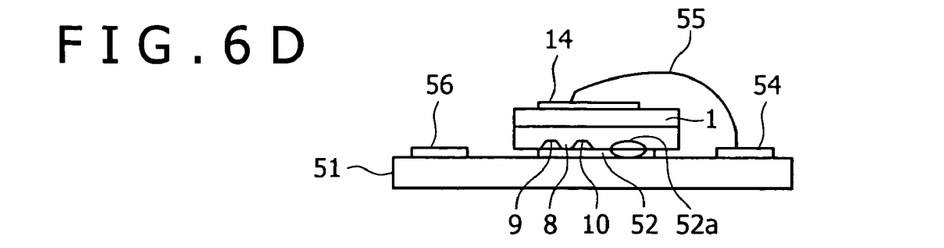

According to this second embodiment, in addition to the merits owing to the use of the GaN based semiconductor laser according to the first embodiment, the following merits can be obtained. As shown in FIG. 6C (side view), when a pressure is exerted at the time of mounting the GaN based semiconductor laser chip 53 on the sub-mount 51, the solder 52 would flow out to form a protuberant portion. In the case of this embodiment, however, the one side surface of the small-width portion of the solder 52 and the ridge 8 of the GaN based semiconductor laser chip 53 are spaced from each other by the distance $L_1$, the solder 52 is absent on the extension line of the ridge 8, and the one end face of the large-width portion of the solder 52 and the rear-side end face of the GaN based semiconductor laser chip 53 are also spaced from each other by the distance $L_r$, so that the protuberant portion 52a is not formed in the vicinity of the ridge 8 but is formed at a position sufficiently spaced from the ridge 8, as shown in FIG. 6D. Therefore, current leak or dielectric breakdown between the p side and the n side would not easily arise from the protuberant portion 52a. In addition, since the front-side end face of the GaN based semiconductor laser chip 53 is protruding from one side surface of the sub-mount 51 by the distance $L_f$, the problems of a loss in the amount of light and generation of stray light would not arise from a process in which the laser beam outgoing from the front-side end face is reflected by the sub-mount 51. Besides, since the solder 52 is not formed on the back side of the rear-side end face of the GaN based semiconductor laser chip 53, a photo-diode for monitoring the laser beam outgoing from the rear-side end face can be disposed on this portion of the sub-mount 51.

While the embodiments of the present invention have been described specifically above, the invention is not limited to or by the above embodiments, and various modifications based on the technical though of the invention are possible.

For example, the numerical values, structures, substrate, processes and the like mentioned in the above embodiments are mere examples, and numerical values, structures, substrate, processes and the like different from those mentioned above may also be adopted, as required, in carrying out the present invention.

What is claimed is:

1. A semiconductor laser comprising:
   a substrate;
   a first clad layer of a first conduction type on said substrate;
   an active layer on said first clad layer;
   a second clad layer of a second conduction type on said active layer; and
   a contact layer of the second conduction type on said second clad layer,
   wherein,
   an upper portion of each of said second clad layer and said contact layer is provided with a pair of grooves in parallel to each other and at a predetermined interval so as to form a ridge therebetween,
   an electrode on the second conduction type side is formed only on said ridge,
   an insulation layer is provided on side surfaces of said ridge, on the inside of said grooves, and on said contact layer in the areas on the outside of said grooves, and the thickness of those portions of said insulation layer which are located on said contact layer in said areas on the outside of said grooves is greater than at least the thickness of said electrode on the second conduction type side,
   a pad electrode is formed to cover said electrode on the second conduction type side and to extend on said insulation layer on the upper side of said areas on the outside of said grooves, and the upper surfaces of those portions of said pad electrode which are located on the upper side of said areas on the outside of said grooves are located above the upper surface of that portion of said pad electrode which is located on the upper side of said ridge, and
   said second conduction type electrode covers said contact layer of the second conduction type and said insulating layer.

2. The semiconductor laser as set forth in claim 1, wherein said first clad layer, said active layer, said second clad layer and said contact layer are comprised of a nitride based Group III-V compound semiconductor.

3. The semiconductor laser as set forth in claim 1, wherein said substrate is a conductive semiconductor substrate.

4. The semiconductor laser as set forth in claim 1, wherein said substrate is comprised of a nitride based Group III-V compound semiconductor.

5. The semiconductor laser as set forth in claim 1, wherein said substrate is a GaN substrate.

6. The semiconductor laser as set forth in claim 1, wherein an electrode on the first conduction type side is formed on the back side of said substrate.

7. A method of mounting a semiconductor laser on a sub-mount, said method comprising the steps of:
   forming a substrate;
   forming a first clad layer of a first conduction type on said substrate;
   forming an active layer on said first clad layer;
   forming a second clad layer of a second conduction type on said active layer; and
   forming a contact layer of the second conduction type on said second clad layer,
   providing upper portions of each of said second clad layer and of said contact layer with a pair of grooves in parallel to each other and at a predetermined interval so as to form a ridge therebetween;
   forming an electrode on the second conduction type side only on said ridge,
   providing an insulation layer on side surfaces of said ridge, on the inside of said grooves, and on said contact layer in the areas on the outside of said grooves, and the thickness of those portions of said insulation layer which are located on said contact layer in said areas on the outside of said grooves is greater than at least the thickness of said electrode on the second conduction type side,
   forming a pad electrode to cover said electrode on the second conduction type side and to extend on said insulation layer on the upper side of said areas on the outside of said grooves, and the upper surfaces of those portions of said pad electrode which are located on the upper side of said areas on the outside of said grooves are located above the upper surface of that portion of said pad electrode which is located on the upper side of said ridge, and
   mounting said semiconductor laser on said sub-mount by soldering, a pattern of a solder corresponding to said soldering is such that said solder is absent on an extension line of said ridge of said semiconductor laser, and said mounting is performed such that an end face on the front side of said semiconductor laser protrudes to the outside of said sub-mount,
   wherein,
   said second conduction type electrode covers said contact layer of the second conduction type and said insulating layer.

8. A semiconductor laser mounted structure comprising a semiconductor laser mounted on a sub-mount, said semiconductor laser comprising:
   a substrate;
   a first clad layer of a first conduction type on said substrate;
   an active layer on said first clad layer;
   a second clad layer of a second conduction type on said active layer; and
   a contact layer of the second conduction type on said second clad layer,
   wherein,
   an upper portion of said second clad layer and said contact layer are provided with a pair of grooves in parallel to each other and at a predetermined interval so as to form a ridge therebetween,
   an electrode on the second conduction type side is formed only on said ridge,
   an insulation layer is provided on side surfaces of said ridge, on the inside of said grooves, and on said contact layer in the areas on the outside of said grooves, and the thickness of those portions of said insulation layer which are located on said contact layer in said areas on the outside of said grooves is greater than at least the thickness of said electrode on the second conduction type side,
   a pad electrode is formed to cover said electrode on the second conduction type side and to extend on said insulation layer on the upper side of said areas on the outside of said grooves, and the upper surfaces of those portions of said pad electrode which are located on the upper side of said areas on the outside of said grooves are located above the upper surface of that portion of said pad electrode which is located on the upper side of said ridge, said semiconductor laser is mounted on said sub-mount by soldering, a pattern of a solder corresponding to said soldering is such that said solder is absent on an extension line of said ridge of said semiconductor laser, and said mounting is performed such that an end face on the front side of said semiconductor laser protrudes to the outside of said sub-mount, and wherein, said second conduction type electrode covers said contact layer of the second conduction type and said insulating layer.

9. An optical disk system using a semiconductor laser as a light source, said semiconductor laser comprising:

a substrate;

a first clad layer of a first conduction type on said substrate;

an active layer on said first clad layer;

a second clad layer of a second conduction type on said active layer; and a contact layer of the second conduction type on said second clad layer, wherein, an upper portion of said second clad layer and said contact layer are provided with a pair of grooves in parallel to each other and at a predetermined interval so as to form a ridge therebetween, an electrode on the second conduction type side is formed only on said ridge, an insulation layer is provided on side surfaces of said ridge, on the inside of said grooves, and on said contact layer in the areas on the outside of said grooves, and the thickness of those portions of said insulation layer which are located on said contact layer in said areas on the outside of said grooves is greater than at least the thickness of said electrode on the second conduction type side, a pad electrode is formed to cover said electrode on the second conduction type side and to extend on said insulation layer on the upper side of said areas on the outside of said grooves, and the upper surfaces of those portions of said pad electrode which are located on the upper side of said areas on the outside of said grooves are located above the upper surface of that portion of said pad electrode which is located on the upper side of said ridge, and wherein, said second conduction type electrode covers said contact layer of the second conduction type and said insulating layer.

* * * * *